United States Patent
Singer (10) Patent No.: US 7,781,750 B2
(45) Date of Patent: Aug. 24, 2010

(54) OBLIQUE MIRROR-TYPE NORMAL-INCIDENCE COLLECTOR SYSTEM FOR LIGHT SOURCES, PARTICULARLY EUV PLASMA DISCHARGE SOURCES

(75) Inventor: Wolfgang Singer, Aalen (DE)

(73) Assignee: Carl Zeiss SMT AG, Oberkochen (DE)

(*) Notice: Subject to any disclaimer, the term of this patent is extended or adjusted under 35 U.S.C. 154(b) by 778 days.

(21) Appl. No.: 10/569,574

(22) PCT Filed: Aug. 27, 2003

(86) PCT No.: PCT/EP03/09466

§ 371 (c)(1),
(2), (4) Date: Sep. 1, 2006

(87) PCT Pub. No.: WO2005/031748

PCT Pub. Date: Apr. 7, 2005

(65) Prior Publication Data

US 2007/0058244 A1 Mar. 15, 2007

(51) Int. Cl.
*G02B 5/08* (2006.01)
*G21K 5/04* (2006.01)

(52) U.S. Cl. .............. 250/504 R; 250/493.1; 359/350; 359/361; 359/845; 359/846; 359/850

(58) Field of Classification Search .......... 359/196.1, 359/198.1, 200.1, 200.2, 351, 355, 357, 361, 359/350, 838, 840, 846, 850, 857, 858, 859, 359/861, 839; 250/504 R, 505.1, 493.1, 250/492.1, 492.2, 458.1, 459.1, 461.1, 49.1, 250/503.1; 378/70, 76, 145, 147, 161, 204; 356/51

See application file for complete search history.

(56) References Cited

U.S. PATENT DOCUMENTS

| | | | |
|---|---|---|---|
| 4,521,068 A * | 6/1985 | Schulte in den Baumen | 250/353 |
| 5,737,137 A * | 4/1998 | Cohen et al. | 359/859 |
| 5,763,930 A | 6/1998 | Partlo | 250/504 R |
| 6,195,201 B1 | 2/2001 | Koch et al. | |

(Continued)

FOREIGN PATENT DOCUMENTS

DE 19903807 11/1999

(Continued)

OTHER PUBLICATIONS

PCT International Search Report dated Mar. 26, 2004 in connection with PCT App. No. PCT/EP03/09466.

(Continued)

*Primary Examiner*—Jack I Berman
*Assistant Examiner*—Nicole Ippolito Rausch
(74) *Attorney, Agent, or Firm*—Fish & Richardson P.C.

(57) ABSTRACT

There is provided a collector system. The collector system includes a first collector mirror and a second collector mirror. The first collector mirror receives EUV light from a light source at a first aperture angle via a first beam path, and reflects the EUV light at a second aperture angle along a second beam path. The first aperture angle is larger than or substantially equal to the second aperture angle. The second mirror receives the EUV light from the first mirror at the second aperture angle. The collector is an oblique mirror type normal incidence mirror collector system.

25 Claims, 3 Drawing Sheets

U.S. PATENT DOCUMENTS

| | | |
|---|---|---|
| 6,198,793 B1 | 3/2001 | Schultz et al. ............... 378/34 |
| 6,438,199 B1 | 8/2002 | Schultz et al. ............... 378/34 |
| 6,600,552 B2 | 7/2003 | Dinger |
| 6,655,808 B2 | 12/2003 | Antoni et al. |
| 2002/0034091 A1 | 3/2002 | Miyakawa et al. .......... 365/145 |
| 2002/0113954 A1* | 8/2002 | Antoni et al. ................ 355/53 |
| 2002/0154395 A1* | 10/2002 | Mann et al. ................. 359/364 |
| 2003/0012333 A1* | 1/2003 | Schultz et al. ............... 378/34 |
| 2003/0004345 A1 | 2/2003 | MacDonald et al. |
| 2003/0043455 A1 | 3/2003 | Singer et al. |
| 2003/0086524 A1* | 5/2003 | Schultz et al. ............... 378/34 |
| 2003/0227606 A1* | 12/2003 | Sweatt ......................... 355/53 |
| 2005/0270513 A1* | 12/2005 | Dierichs et al. .............. 355/67 |
| 2007/0114468 A1* | 5/2007 | Partlo et al. ............. 250/504 R |

FOREIGN PATENT DOCUMENTS

| | | |
|---|---|---|
| EP | 1189089 | 3/2002 |
| EP | 1255163 | 11/2002 |
| EP | 1319988 | 12/2002 |
| EP | 1 319 988 | 6/2003 |
| JP | 2000003858 | 1/2000 |
| JP | 2000100697 | 4/2000 |
| JP | 2002184690 | 6/2002 |
| JP | 2003142296 | 5/2003 |
| JP | 2004095908 | 3/2004 |

OTHER PUBLICATIONS

Ulrich et al. "Trends in Optical Design of Projection Lenses for UV-and EUV-Lithography". Proceedings of SPIE vol. 4146. 2000, pp. 13-24.

European Search Report dated Feb. 17, 2006, based on PCT/EP2003/09466.

Cohen et al., "Critical Illumination Condenser for EUV Projection Lithography". OSA Proceedings on Extreme Ultraviolet Lithography, 1994, vol. 25 (pp. 109-115).

Antoni, M., et al., "Illumination Optics Design for EUV-Lithography," Soft X Ray and EUV Imaging Systems, W.M. Kaiser, R.H. Stulen (editors), Proceedings of SPIE, vol. 4146, 2000, pp. 25-34.

* cited by examiner

OBLIQUE MIRROR-TYPE NORMAL-INCIDENCE COLLECTOR SYSTEM FOR LIGHT SOURCES, PARTICULARLY EUV PLASMA DISCHARGE SOURCES

BACKGROUND OF THE INVENTION

1. Field of the invention

The invention relates to an oblique mirror-type normal-incidence collector system, in particular for light sources which predominantly emit radiation with wavelengths of $\leq 193$ nm. Most particularly preferred are EUV light sources, in particular EUV plasma discharge sources. In addition, the invention describes an illumination system comprising such a collector system, which preferably is assigned to an EUV projection exposure unit, in particular for EUV lithography.

2. Description of the Prior Art

In order to be able to still further reduce pattern widths for electronic components, in particular to the submicron range, it is necessary to reduce the wavelengths of the light used for microlithography. The use of light with wavelengths of $\leq 193$ nm is conceivable, for example, lithography with soft x-rays, so-called EUV lithography.

EUV lithography is one of the most promising lithography techniques for the future. At the present time, wavelengths in the range of 11-14 nm, in particular, 13.5 nm, are discussed as wavelengths for EUV lithography, with a numerical aperture of 0.2-0.3. The image quality in EUV lithography is determined, on the one hand, by the projection objective, and, on the other hand, by the illumination system. The illumination system will provide an illumination that is as uniform as possible of the field plane, in which the pattern-bearing mask, the so-called reticle, is disposed. The projection objective images the field plane into an image plane, the so-called wafer plane, in which a light-sensitive object is disposed. Projection exposure systems for EUV lithography are designed with reflective optical elements. The shape of the field of an EUV projection exposure unit is typically that of an annular field with a high aspect ratio of 2 mm (width)×22-26 mm (arc length). The projection systems are usually operated in scanning mode, wherein the reticle will be moved in the field plane and the light-sensitive object, typically a wafer with a suitable photoresist, will be moved in the image plane, synchronously relative to one another. With respect to EUV projection exposure units, reference is made to the following publications:

W. Ulrich, S. Beiersdörfer, H. J. Mann, "Trends in Optical Design of Projection Lenses for UV- and EUV-Lithography" in Soft-X-Ray and EUV Imaging Systems, W. M. Kaiser, R. H. Stulen (editors), Proceedings of SPIE, Vol. 4146 (2000), pp. 13-24 and M. Antoni, W. Singer, J. Schultz, J. Wangler, I. Escudero-Sanz, B. Kruizinga, "Illumination Optics Design for EUV-Lithography" in Soft X Ray and EUV Imaging Systems, W. M. Kaiser, R. H. Stulen (editors), Proceedings of SPIE, Vol. 4146 (2000), pp. 25-34 the disclosure content of which is incorporated to the full extent in the present Application.

For uptake of the radiation of EUV light sources, in particular of laser-plasma sources and of discharge sources, grazing-incidence collectors are utilized according to the prior art, i.e, those in which the EUV radiation strikes the reflective surfaces at a grazing incidence with the formation of a total reflection. Such collectors can be designed, for example, as nested systems, which are comprised of several collector shells and at which two reflections occur each time. Such nested collectors are also called Wolter systems. Mirror systems are utilized in such collector systems, these mirror systems, for example, consisting of a combination of hyperboloid-shaped and ellipsoid-shaped mirrors and whose principle was described for the first time in the literature in Annalen der Physik 10, 94-114, 1952, wherein the disclosure content of this document is incorporated to the full extent in the present Application.

The advantage of this type of collector consists of the fact that even with large-scale light sources, such as, for example, discharge sources, the power irradiated in the half-space is taken up and bundled in the forward direction. A corresponding design is known from U.S. Pat. No. 5,763,930. In this case it also must be taken into consideration that it is not possible using this principle to bend back the beam path in the vicinity of the light source which would reduce the size of the illumination system, and also the extension of the light source also runs counter to such bending back according to the current prior art.

Another disadvantage of grazing-incidence collectors is their shadowing effects, which arise due to the unavoidable mechanical holders, particularly in the case of a nested structure. These collectors can be constructed in a filigree pattern, e.g., in the form of a spoked wheel, but these lead to radiation losses especially in the case of small sources. A similar problem results with respect to the cooling equipment of the grazing-incidence collector, which adds further mechanical structures and thus contributes to the shading losses. Such cooling equipment cannot be omitted, since for lithography at 13.5 nm, due to the necessity of forming a vacuum, the heat transfer is insufficient and the thermal stress would lead to an intolerable deformation of the mirror shells.

Collectors with a single normal-incidence collector mirror, such as have become known, for example, from EP 1,255, 163, can in fact be well cooled on the back side, but a shading which results from the finite extent of the light source cannot be avoided. If a discharge source is present instead of a laser plasma source, then the space requirement which results due to the extended electrodes leads to an intense reduction of the illumination power. In order to avoid this problem, another bending back can be undertaken in the vicinity of the source. Such collectors, which are composed of two normal-incidence mirrors disposed in the form of a Schwarzschild system, have become known from U.S. Pat. No. 5,737,137 and have also been propsed in EP 1,319,988 A2 for the individual focusing of EUV light sources in an arrangement with a plurality of light sources. Here, it is impossible, for reasons of space, to arrange a particle filter after the light source, so that there is a particularly rapid polluting of normal-incidence mirrors in the vicinity of the source. In addition, the collectors with Schwarzschild arrangement, which are known from the prior art, are characterized in that the radiation emitted from the EUV light source is taken up by the first normal-incidence collector mirror with a small numerical aperture of typically NA~0.3. When going to larger collection angles in such a system, the angles of incidence on the second collector mirror increase in relation to the surface normal line, which is accompanied by a reduced reflectivity and an increased polarizing effect of the multi-layer reflection coating.

SUMMARY OF THE INVENTION

The object of the invention consists of configuring a collector system consisting of normal-incidence mirrors for a light source, in particular, an EUV light source, whereby laser plasma or discharge light sources are particularly preferred for this source, in such a way that the problems of the prior art indicated above are overcome. Thus, a particularly well-cooled collector system should be provided which takes up the radiation of the light source with a large numerical aperture and thus a high collection aperture, as well as simultaneously makes possible small radiation losses as well as angles of incidence that are as small as possible on the multilayer reflection films of the mirrors of the collector. The collector system will also provide sufficient structural space for the screening of the light source and contribute to an overall length of the illumination system that is as short as possible, as well as produce a spectrally pure illumination radiation.

The inventors have recognized that with a collector system comprised of two normal-incidence mirrors, when employing an oblique mirror-type structure of a Schwarzschild system, a high collection aperture can be combined with sufficiently small angles of incidence. Collection aperture is understood in the present Application as the numerical aperture taken up by the first collector mirror; this is designated below as the first numerical aperture, to which is assigned a first aperture angle. For this purpose, a collector system according to the invention is constructed in such a way that the numerical aperture bent back, i.e., reflected, from a first normal-incidence mirror is smaller than or equal to the collection aperture. Resulting from this is an increase of the mirror size of the second normal-incidence mirror, which in turn is positioned at a distance to the first normal-incidence mirror, which approximates as much as possible the distance to the source. According to the invention, this is achieved by a non-symmetrical structure, i.e., an oblique mirror-type construction of the collector. It is to be understood by this that the axial symmetry of the collector is no longer given. Here, the second normal-incidence mirror is essentially positioned next to the light source. Sufficient structural space for the inclusion of the light source in its own compartment can be created thereby and at the same time, the second normal-incidence mirror can be formed correspondingly enlarged and can be positioned at a sufficient distance to the first normal-incidence mirror. Also, with such an arrangement, the back side of the mirror elements can be cooled in a simple manner.

In an advantageous configuration of the invention, at least the first normal-incidence mirror is adapted to the off-axis positioning of the second normal-incidence mirror by means of the incorporation of conical parts. Conical parts in this configuration may also be used for only one of these mirrors.

BRIEF DESCRIPTION OF THE DRAWINGS

The invention will be described below with examples on the basis of the drawings.

Herein is shown.

DESCRIPTION OF THE INVENTION

Figure 2:
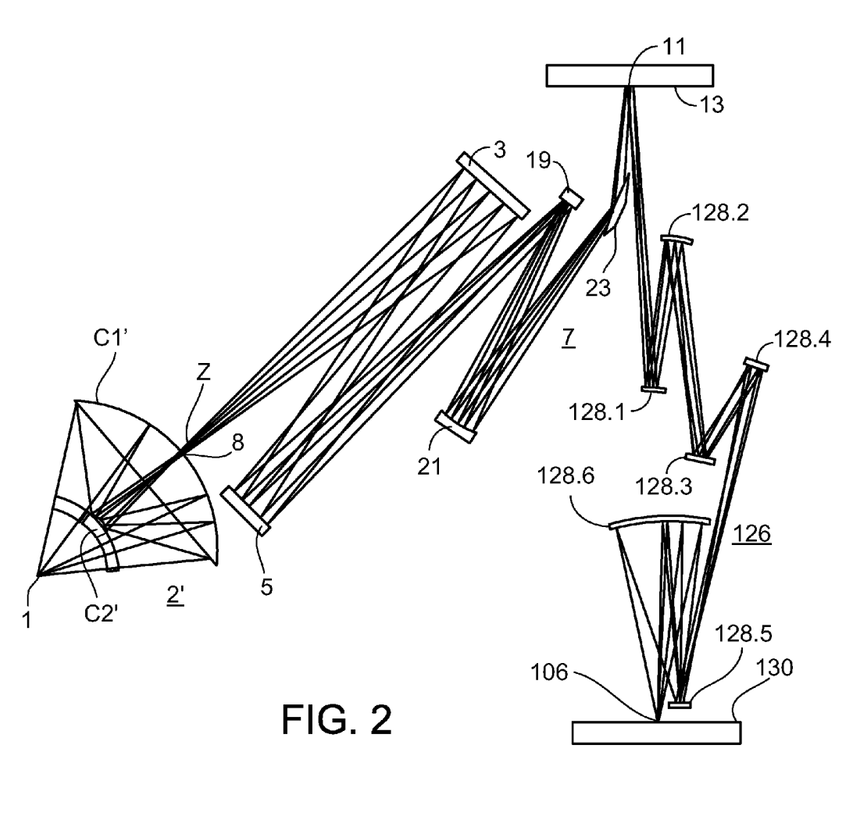
FIG. 2 the structure of a lithography system with an axial-symmetric Schwarzschild collector system corresponding to the prior art.

FIG. 2 shows the typical structure of an EUV lithography system for microlithography, which comprises a Schwarzschild collector system 2' corresponding to the prior art.

The schematically simplified representation of the Schwarzschild collector system 2' shows a first normal-incidence collector mirror C1', which takes up light from light source 1 by its concave, for example, parabolic or elliptical shape and bends it back, i.e., reflects it, onto the second normal-incidence collector mirror C2', which in turn can be of hyperbolic or ellipsoid shape. This second normal-incidence collector mirror C2' is thus disposed so that it is centered relative to the first normal-incidence collector mirror C1', so that a symmetrical collector system is formed, which images the light source 1 onto a magnified intermediate image Z. A passage 8 is provided in the first normal-incidence collector mirror C1' for the radiation exiting from the second normal-incidence collector mirror C2'. Accordingly, light from light source 1 is taken up by the first normal-incidence collector mirror C1' at a first aperture angle and irradiated to the second normal-incidence collector mirror C2' at a second aperture angle. A third aperture angle is in turn assigned to the light bundle exiting from the second normal-incidence collector mirror C2'. In the present Application, aperture angle is understood to be the angle between the edge ray of a light bundle and the maximum beam angle relative to the optical axis. Under the vacuum conditions prevailing in EUV illumination, the numerical aperture then results from the sine of the aperture angle.

The task of the collector system is to take up a large first aperture angle, for example, of 45°, from the source, and to convert this into an essentially smaller third aperture angle, for example, of 6° after the collector system, whereby the third aperture angle is adapted to the downstream illumination system. For example, a half open-angle or first aperture angle of 45° at the first normal-incidence collector mirror C1' leads to a third aperture angle of 6° at the second normal-incidence collector mirror C2', and therefore to a reduction in the numerical aperture from approximately NA~0.7 to approximately NA~0.1, corresponding to an imaging scale factor of the collector of approximately 7.

The second normal-incidence collector mirror C2' must necessarily be made small in shape due to the bending, i.e., reflecting, back of the beam path and must be positioned at a certain distance relative to the light source 1. This results in the disadvantage that the second aperture angle of the beam path after the first normal-incidence collector mirror C1' must be larger than the first aperture angle taken up from the source by means of the first normal-incidence collector mirror. In the present example, the focal intercept, i.e., the intercept distance, between the source and the first collector mirror C1' amounts to 450 mm; the focal intercept between the first collector mirror C1' and the virtual intermediate image of the source (not depicted in FIG. 2) amounts to 280 mm, from which the imaging scale factor can be estimated at 280 mm/450 mm=0.622, i.e., the sine of the second aperture angle is approximately 1/0.622=1.61 times greater than the sine of the first aperture angle. Even a small first aperture angle of only 38° leads in this case to a second aperture angle of 90°. This large second aperture angle must be converted by means of the second normal-incidence collector mirror C2' into the essentially smaller third aperture angle exiting from the second normal-incidence collector mirror C2'. In an actual design of normal-incidence collectors, it has been established that deviations from the sine condition in the imaging of the light source result due to the collector mirrors C1' and C2'. Nevertheless, the above approximation correctly reproduces the basic problem.

This disadvantageous effect is clear upon consideration of an edge ray exiting from the first normal-incidence collector mirror C1' in FIG. 2, which bounds the first aperture angle of approximately 38°, which corresponds to a collection aperture of approximately 0.6. For the second aperture angle, given by the edge ray, which is irradiated by the first normal-incidence collector mirror, there follows an angle of approximately 60°, which, as set forth above, is considerably larger than the first aperture angle in the case of two-mirror normal-incidence collectors according to the prior art. At the second normal-incidence collector mirror C2', the edge ray at the second aperture angle of 60° is thus deviated by −6° relative to the edge ray at the third aperture angle, whereby each time the angle refers to the beam angle relative to the axis of symmetry. A larger angle of incidence of 33° thus arises relative to the mirror surface of the second normal-incidence collector mirror C2', so that a reduction of the reflectivity of the mirror surface occurs as well as undesired polarization effects.

From the requirement of the above-named reduction of the numerical aperture from the first to the third aperture angle, there consequently results the disadvantage from the prior art that the first aperture angle and thus the power that can be taken up from the light source is limited, since the second aperture angle must be larger than the first aperture angle. The second aperture angle could in principle be larger than 90°, but, due to the large angle spectrum, this leads all the more to a great loss of reflectivity of the multi-layer system of the second normal-incidence collector mirror, as well as to intense polarization effects. Further, a second normal-incidence collector mirror shaped in such a way would lead to problematical geometric ratios.

Also shown in FIG. 2, proceeding in the light path from a light source 1 to an illuminated plane, which is called the field plane 13, are optical components of an illumination system as well as the projection objective 126 of a projection exposure unit. All components of the illumination system and of the projection objective bear the same reference numbers as the corresponding components in FIG. 1. Reference is made to the description in FIG. 1 relative to these components.

Figure 1:
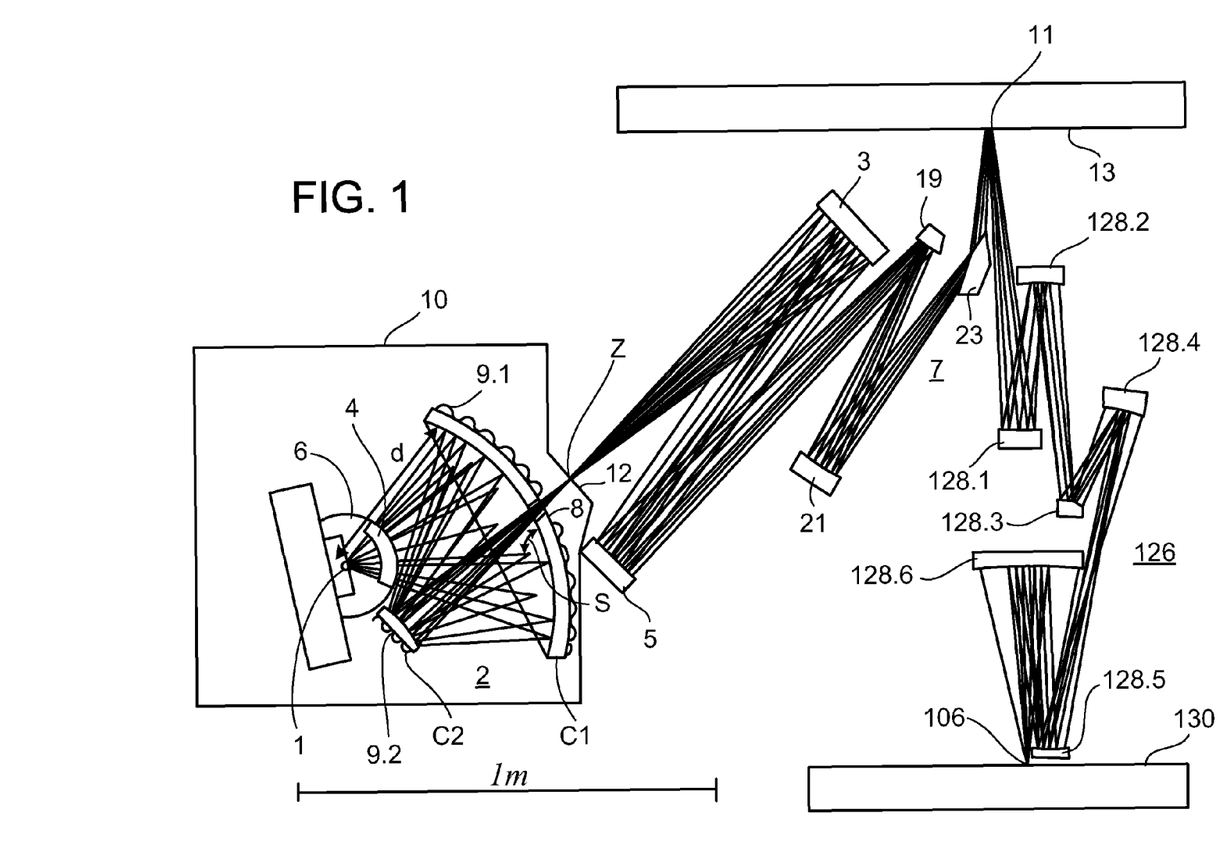
FIG. 1 the structure of a lithography system with an oblique mirror-type Schwarzschild collector system according to the invention.

FIG. 1 shows a projection exposure unit, whose illumination system comprises a collector system 2 according to the invention. The collector system according to the invention is formed as an oblique mirror system in a Schwarzschild arrangement, i.e., first and second normal-incidence collector mirrors C1 and C2 are not arranged or shaped in an axial-symmetric manner. In schematically simplified representation, a concavely shaped first normal-incidence collector mirror C1 is shown, which bends back the light onto the second normal-incidence collector mirror C2. Here, in the present Application, a normal-incidence mirror is understood to be a mirror in which the angles of incidence relative to the mirror normal line are smaller than 70°. With this condition, the concept of bending back the beam path is also established by the first, concavely shaped normal-incidence collector mirror C1.

Figure 3:
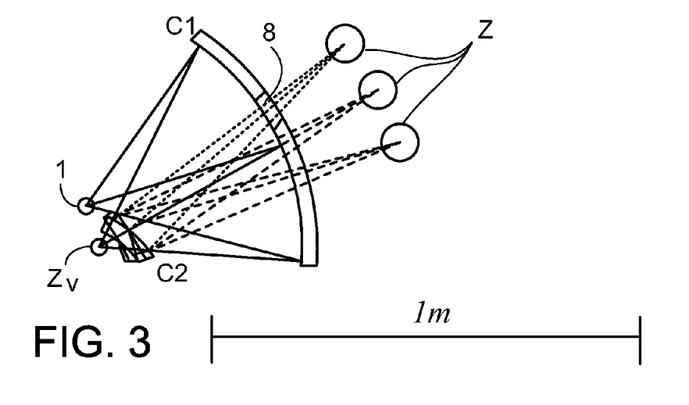
FIG. 3 an oblique mirror-type Schwarzschild collector system with an adjustable second normal-incidence mirror.

According to the invention, the first normal-incidence collector mirror C1 does not have a reducing imaging effect on the image of the light source, so that the first aperture angle taken up by the first collector mirror C1 is larger than or substantially equal to the second aperture angle, which is emitted by the first collector mirror C1 and is taken up by the second collector mirror C2. Due to the effect of the first normal-incidence collector mirror C1 according to the invention, as shown in FIG. 3, the light source 1 is imaged into a virtual intermediate image $Z_v$, which has a distance to the first normal-incidence collector mirror C1 that is equal to or greater than the distance of the light source 1 to the normal-incidence collector mirror C1. Due to the oblique mirror-type arrangement, a normal-incidence collector mirror C2, which is preferably clearly larger when compared with the prior art, is disposed extra-axially, i.e., it is positioned laterally next to light source 1.

Proceeding from the selected positioning of the second normal-incidence collector mirror C2, the latter is preferably adjusted in its size such that it covers the entire second aperture angle of the radiation exiting from the first normal-incidence collector mirror C1. Further, the second normal-incidence collector mirror C2 is preferably configured such that the intermediate image Z of the light source 1 is substantially shaped by means of the first normal-incidence collector mirror C1 in the region of a passage 8.

In another configuration, the intermediate image Z of the light source 1 is formed on the side of the first normal-incidence collector mirror C1 that lies opposite the second normal-incidence collector mirror C2. The radiation exiting from the second normal-incidence collector mirror C2 is thus also advantageously guided through a passage 8 in the first normal-incidence collector mirror C1 and is imaged on the intermediate image Z outside the region of the rear walls that may contain cooling devices of the first normal-incidence collector mirror C1.

The formation of the intermediate image Z of the light source 1 is of advantage, since it is thus possible to enclose the light source 1 and the collector system 2 in a compartment that is atmospherically separated from the downstream system. Such a compartment is sketched in FIG. 1 and provided with the reference number 10. It is also possible, based on the formation of the intermediate image Z of the light source 1 to incorporate in the beam path a diaphragm 12, which cooperates, for example, with a raster spectral filter for the spectral filtering of the illumination.

If a segment with an axis of symmetry is used for the first normal-incidence collector mirror C1, then neither the light source 1 nor the second normal-incidence collector mirror C2 will lie on this axis of symmetry, but these components are positioned lying opposite and at a distance to this axis. Here, the distance is defined as the distance between the central point of the second normal-incidence collector mirror C2 and the light source 1. This distance is at least long enough that the entire second normal-incidence collector mirror C2 is situated outside the region near the light source, whereby the region near the light source is preferably understood as the region around the source point of the EUV light source up to a distance of at least 100 mm and, particularly preferred, of 200 mm.

If there is no axis of symmetry at the first normal-incidence collector mirror C1, then the distanced positioning of the second normal-incidence collector mirror C2 is referred to the perpendicular distance relative to a straight line that is established by the EUV light source 1 and the vertex S of the first normal-incidence collector mirror C1. The vertex S for a multi-segment first normal-incidence collector mirror C1 is defined as the vertex of the envelope of the mirror surface.

In this way, the radiation exiting from the light source can reach the first normal-incidence collector mirror C1 without shading losses and, at the same time, a sufficient distance can be achieved between the first and the second normal-incidence collector mirrors C1 and C2, whereby this distance is approximately the same as the distance between the light source 1 and the first normal-incidence collector mirror C1.

Due to the oblique mirror-type structure of the collector according to the invention and the enlargement of the second collector mirror C2 made possible thereby, as well as its extended distance relative to the first collector mirror C1, the limitation of the numerical aperture in the case of Schwarzschild collectors for EUV light sources as is known from the prior art is successfully overcome. Here, the angles of incidence at the second collector mirror C2, even for a numerical aperture of NA>0.6 and larger, which the first collector mirror C1 takes up from the light source 1, are still small enough that the reflection losses and the undesired polarization effects can be tolerated. Thus, if first aperture angles that are as large as possible are preferred, i.e., for the numerical aperture with which the first normal-incidence collector mirror C1 collects radiation from light source 1, then a value of NA≧0.5 and particularly of NA≧0.6 and especially of NA≧0.7 is preferred. Due to the oblique mirror-type structure of the collector according to the invention, particularly high first aperture angles and thus numerical apertures of NA≧0.85 are also conceivable.

FIG. 1 sketches an advantageous configuration of the collector according to the invention, in which the first beam path exiting from light source 1 is shown, while that beam path which travels to the second normal-incidence collector mirror C2 and is designated the second beam path no longer penetrates up to a certain distance from light source 1. This region through which the second beam path does not penetrate preferably has a minimum radius of 100 mm around the light source 1 and 200 mm is particularly preferred. In general, it is preferred that in the case of a given minimum distance d from the light source 1 to the mirror surface of the first normal-incidence collector mirror C1, the second beam path will not pass through a region around light source 1 with a minimum radius of d/5 or, particularly preferred, of d/3. In addition, it is preferred that in this region within the minimum radius, no optical components, including the mechanical mounting structures assigned to them will be found. As an additional advantage according to the invention, it is achieved herewith that sufficient structural space for the configuration of a compartment 6 enclosing the light source 1 is provided. In such a compartment 6, the atmosphere that surrounds light source 1 is separated from the downstream region of the illumination system placed under vacuum, so that any contamination coming from light source 1 cannot reach this vacuum region. Here, a particle filter is used, for example, which is constructed as a zirconium foil in one possible design, in order to allow the EUV radiation to pass, but retains the debris coming from light source 1. Further, additional or alternative electrical or magnetic fields can be used for trapping electrically charged dirt particles. Also, large-scale EUV light sources, such as, e.g., discharge sources, in the case of an oblique mirror-type Schwarzschild collector system according to the invention with a lateral positioning of the second normal-incidence collector mirror C2, do not prevent the bending back of the beam path in the vicinity of the light source 1.

In a first preferred embodiment, the reflective surface of the first normal-incidence collector mirror C1 is shaped as a segment of an ellipsoid, whereas the extra-axially, i.e., off axis, positioned second normal-incidence collector mirror C2 is shaped as a segment of a hyperboloid. In particular, the first normal-incidence collector mirror C1 has a large structural size in order to achieve a sufficiently large aperture, so that it is constructed of several individual segments in an advantageous configuration of the invention. These can be mounted directly next to one another on a common support structure or they can have individual holders that can move relative to one another. The second normal-incidence collector mirror C2 can also be constructed in this way from individual segments. Due to the high thermal load of the normal-incidence collector mirrors C1 and C2, these mirrors are advantageously cooled. For this purpose, a cooling devices 9.1 and 9.2 for the first collector mirror C1 or the second collector mirror C2 can be utilized for example, devices, which operate with a cooling medium, e.g., with water, or by means of Peltier cooling. Due to the bending back in the collector system according to the invention by means of an oblique mirror-type arrangement, sufficient structural space is present in back, both at the first as well as the second normal-incidence collector mirrors C1 and C2, in order to be able to accommodate such cooling devices.

In addition, the optical components of the illumination system as well as the projection objective 126 disposed downstream to the collector system 2 according to the invention in the light path from the light source 1 to the illuminated field plane 13 are shown in FIG. 1. The following are shown individually in FIG. 1: A reticle or a mask 11 is positioned in the field plane 13 of a projection exposure unit and imaged by means of a reduction optics 126 onto its image plane 130, in which a wafer 106 provided with a light-sensitive material is typically found. FIG. 1 shows for this purpose, as an example, a projection objective consisting of six individual mirrors 128.1 to 128.6, which is derived, for example, from U.S. Pat. No. 6,600,552, which is incorporated to the full extent in the present Application. Also depicted is a telecentric illumination of image plane 130 in the ideal case, i.e., the chief ray of a beam bundle, which proceeds out from a field point of field plane 13, and perpendicularly intersects the image plane 130. In addition, the projection objective 126 has an entrance pupil which in general coincides with the exit pupil of the illumination system.

FIG. 1 also shows the typical structure of an EUV illumination system, which is formed as a double-facetted illumination system according to U.S. Pat. No. 6,198,793 B1, whereby the content of this document is incorporated to the full extent in the present Application. Such a system comprises a first optical element with first raster elements 3, which is also designated as a field facet mirror 3. A second optical element with second raster elements 5, which is usually named a pupil facet mirror 5, then follows in the beam path.

Field facet mirror 3 and pupil facet mirror 5 serve for the illumination of a field in the field plane 13 as well as the shaping of the illumination in the exit pupil of the illumination system. The effect of each field raster element is such that it forms an image of light source 1, wherein a plurality of so-called secondary light sources is formed by the plurality of field facets or field raster elements. The secondary light sources are formed in or near the plane in which the pupil facet mirror 5 is disposed. Thus, as shown in FIG. 1, if the secondary light sources come to lie in the region of the pupil facet mirror 5, the field facets themselves can have an optical effect, for example, a collecting optical effect. These secondary light sources are imaged by the downstream optical elements as tertiary light sources in the exit pupil of the illumination system.

In addition, each field raster is imaged in the field plane 13 by the facets of the pupil facet mirror 5 and the downstream optical elements of the second optical component 7, which, in the example of FIG. 1, consists of the following three optical elements: a first reflective optical element 19, a second reflective optical element 21 and the grazing-incidence mirror 23. The images of the field facets that are superimposed therein serve for the illumination of a mask 11 in the field plane 13, whereby, typically, starting from rectangular or arc-shaped field facets, an illumination in the form of an annular field segment arises in the field plane 13. In general, the microlithography system is formed as a scanning system, so that the mask 11 in the field plane 13 and the wafer 106 in the image plane 130 are moved synchronously in order to effect an illumination or an exposure.

A configuration of the oblique mirror-type Schwarzschild collector according to the invention, in which different tilting angles can be adjusted for the second normal-incidence collector mirror C2, is shown in FIG. 3. The position of the virtual intermediate image $Z_v$ is established starting from the established positions of the light source 1 and of the first normal-incidence collector mirror C1. The position and the orientation of the magnified intermediate image Z of the light source 1 can be adjusted by the variation of adjustment of the second normal-incidence collector mirror C2. For example, three different tilting angles of the second normal-incidence collector mirror C2 are sketched in FIG. 3. It is possible in this way to comply with requirements for structural space resulting for the downstream parts of the microlithography system, or if an EUV light source with a plurality of source points is used, to select between the individual source points. If the second normal-incidence collector mirror C2 is constructed from individual segments, then it is particularly advantageous when a plurality of source points is superimposed, if the tilting angles assigned to the individual segments can be individually adjusted. In general, for a second normal-incidence collector mirror C2 with adjustable tilting angle, either the passage opening 8 in the first normal-incidence collector mirror C1 is configured sufficiently large or the passage opening 8 is adapted to the respective adjustment of the second normal-incidence collector mirror C2. If the first normal-incidence collector mirror C1 is constructed in a modular manner, from individual segments with individual support elements, then the passage opening 8 can be shifted in a relatively simple manner.

Figure 4:
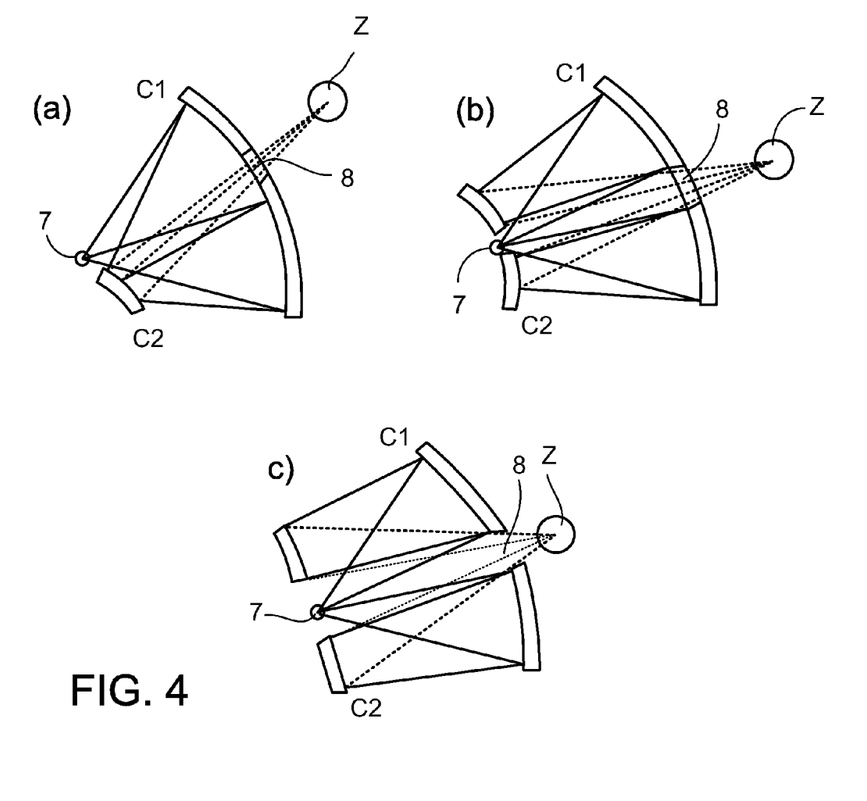
FIG. 4a-c the configuration of an oblique mirror-type Schwarzschild collector with conical parts for shaping the mirror surfaces.

Advantageous configurations of the oblique mirror-type Schwarzschild collector are shown in FIGS. 4a-c. FIG. 4a shows the above-described oblique mirror-type structure of the two-mirror collector with the second normal-incidence collector mirror C2 essentially disposed next to the source. The second normal-incidence collector mirror C2 in FIG. 4b is disposed such that the power irradiated from the source passes through a central opening of the second normal-incidence collector mirror C2. In this configuration, which can also have, for example, a rotation-symmetric collector system, the collection aperture that can be taken up in the second normal-incidence collector mirror C2 is limited, of course, due to the small opening. In FIG. 4c, the first and second normal-incidence collector mirrors C1 and C2 each have shapes which add a conical part to the shape of the mirror. The inventors have recognized that for such a configuration of the mirrors as non-imaging optical elements with conical parts, the structure of the Schwarzschild collector according to the invention with a large collection aperture can be particularly well realized. Here, conical constants are known to the person skilled in the art, for example, from standard software packages for optical design.

By the addition of conical parts to the first normal-incidence collector mirror C1, as shown in FIG. 4c, a centered system can be provided, in which the light source 1 is positioned essentially centrally in the second normal-incidence collector mirror C2. With this measure according to the invention, due to the conical parts on the first collector mirror C1, the central opening in the second collector mirror C2 can be selected larger, whereby a larger aperture angle is achieved according to the invention. The conical part on the first normal-incidence collector mirror C1 can be used not only for this in order to enlarge the central shading in the second normal-incidence collector mirror C2, but also to create in turn structural space for the light source 1 and the components, such as e.g, a particle filter, which surround it. This effect is shown in FIG. 4c.

In another advantageous configuration of the invention, a reflective surface with a raster for spectral filtering is formed on one of the two normal-incidence collector mirrors C1 or C2. Such a raster spectral filter is known from US 2003/0043455 A1, wherein the content of this document is incorporated to the full extent in the present Application. If this spectral raster is provided at the second normal-incidence collector mirror C2, then, by the combined filtering effect from the multi-layer system which derives the useful wavelength of 13.5 nm and wavelengths above 100 nm from the irradiation of the light source, and the raster spectral filter which is adjusted so that the wavelength region of 7 to approximately 27 nm is selected directly, a particularly pure spectral illumination can be achieved. For space reasons, it is advantageous to form the diaphragm system for filtering the undesired diffraction orders substantially in the region of passage 8 by means of the first normal-incidence collector mirror C1.

In an preferred embodiment of the invention, it is conceivable to incorporate additional mirrors in the collector system according to the invention. Such mirrors can contribute to generating an image of the light source or serve for further adaptation of the structural space of the collector. It is also conceivable to form one of the mirrors, which follows the first normal-incidence collector mirror C1, as a grazing-incidence mirror. Under certain circumstances, a grazing-incidence mirror can also be used for the second collector mirror directly following the first normal-incidence collector mirror C1.

In an advantageous embodiment, at least one of the collector mirrors of the invention according to EP 1,189,089, which is incorporated to the full extent in the present Application, can be mounted mechanically such that the optical properties are not modified with changes in temperature. Further, at least one of the mirrors can be designed as controllable, movable or tiltable, in order to actively adjust the collector mirrors during mounting and to keep them in an ideal state of adjustment during operation.

By providing the oblique mirror-type arrangement of the normal-incidence mirrors of the Schwarzschild collector according to the invention, a projection exposure unit is also disclosed, which comprises an EUV illumination system with such a collector system. Further, a method for exposure for the production of microelectronic components is indicated, in which a projection exposure unit characterized in such a way is used.

LIST OF REFERENCE NUMBERS

1 Light source
2, 2' Collector system
3 First optical element with first raster elements (field facet mirror)
4 Particle filter
5 Second optical element with second raster elements (pupil facet mirror)
6 Compartment for the light source
7 Second optical component
8 Passage in the first normal-incidence mirror
9.1, 9.2 Devices for cooling
10 Compartment for incorporation of the light source 1 and the collector system 2
11 Pattern-bearing mask
13 Field plane
19 First reflective optical element
21 Second reflective optical element
23 Grazing-incidence mirror 27 Exit pupil of the illumination system
104 Mask
106 Wafer provided with a light-sensitive material
120 Projection objective
128.1, 128.2 Mirrors of the projection objective
128.3, 128.4,
128.5, 128.6
130 Image plane
d Minimum distance of light source 1 to the mirror surface of the first normal-incidence
collector mirror C1
C1, C1' first normal-incidence collector mirror
C2, C2' second normal-incidence collector mirror
Z Intermediate image of the light source
$Z_v$ Virtual intermediate image of the light source
S Apical point or vertex of the first normal-incidence collector mirror

The invention claimed is:

1. A collector system comprising:
a first collector mirror having a passage therethrough; and
a second collector mirror,
wherein said first collector mirror receives EUV light from a light source at a first aperture angle via a first beam path, and reflects said EUV light at a second aperture angle along a second beam path,
wherein said first aperture angle is larger than or substantially equal to said second aperture angle,
wherein said second collector mirror receives said EUV light from said first collector mirror at said second aperture angle, and reflects said EUV light through said passage, and
wherein the collector system is an oblique mirror type normal incidence mirror collector system.

2. The collector system of claim 1, wherein said first collector mirror is a concave normal incidence mirror.

3. The collector system of claim 1, wherein at least one of said first collector mirror or said second collector mirror has a conical part for the shaping of a reflection surface.

4. The collector system of claim 1, wherein at least one of said first collector mirror or said second collector mirror comprises a cooling device.

5. The collector system of claim 1, further comprising a raster spectral filter.

6. The collector system of claim 1, wherein at least one of said first collector mirror or said second collector mirror comprises a mirror surface having a raster spectral filter thereon.

7. The collector system of claim 1, wherein said first beam path, but not said second beam path, passes through a region next to said light source at a distance of greater than about 100 mm to said light source.

8. The collector system of claim 1,
wherein said first collector mirror is located at a distance (d) from said light source, and
wherein said light source is at a center of a region having a radius of greater than or equal to d/5, within which said second beam path does not pass.

9. The collector system of claim 8, wherein in said region, said light source is enclosed in a compartment whose atmosphere is separated from a remainder of an illumination system.

10. The collector system of claim 9, further comprising, in said region, a component selected from the group consisting of a particle filter, and a particle trap.

11. The collector system of claim 9, wherein said region is subject to a field that diverts a charged particle from said region.

12. The collector system of claim 1, wherein said collector system generates a real intermediate image of said light source.

13. The collector system of claim 12, wherein said real intermediate image is a magnified intermediate image.

14. The collector system of claim 1, wherein said second collector mirror is a normal-incidence mirror.

15. The collector system of claim 1, wherein said second collector mirror is adjustable in its position and its orientation relative to said first collector mirror.

16. An illumination system comprising:
a light source for EUV light;
a field plane; and
the collector system of claim 1, in a path of said EUV light from said light source to said field plane.

17. The illumination system of claim 16, further comprising:
a first optical element with first raster elements; and
a second optical element with second raster elements,
wherein said first and second optical elements are disposed in the said path downstream of said collector system and upstream of said field plane.

18. The illumination system of claim 17, further comprising an optical component for illumination of a field in said field plane, wherein said optical component is disposed in said path downstream of second optical element and upstream of said field plane.

19. The illumination system of claim 16, further comprising an optical component for illumination of a field in said field plane, wherein said optical component is disposed in said path downstream of said collector system and upstream of said field plane.

20. A projection exposure unit, comprising the collector system of claim 1.

21. A method of producing a microelectronic component, comprising employing the projection exposure unit of claim 20.

22. A collector system comprising:
a first collector mirror having a passage therethrough; and
a second collector mirror,
wherein said first collector mirror (a) receives EUV light via a first beam path from a light source, with a numerical aperture (NA) greater than or equal to about 0.5, and (b) reflects said EUV light into a second beam path proceeding to said second collector mirror,
wherein said second collector mirror receives said EUV light from said first collector mirror, and reflects said EUV light through said passage, and
wherein the collector system is an oblique mirror-type normal incidence mirror collector system.

23. The collector system of claim 22, wherein said first collector mirror is a concave normal incidence mirror.

24. A collector system comprising:
a first collector mirror having a passage therethrough; and
a second collector mirror,
wherein said first collector mirror (a) receives EUV light from a light source at a first aperture angle, and reflects said EUV light at a second aperture angle, and (b) is a concave normal-incidence mirror,
wherein said first aperture angle is larger than or substantially equal to said second aperture angle, and
wherein said second collector mirror (a) is positioned so that a straight line between said light source and a vertex of said first collector mirror does not intersect a mirror surface of said second collector mirror, (b) receives said EUV light from said first collector mirror at said second aperture angle, and (c) reflects said EUV light through said passage.

25. A collector system comprising:
a first collector mirror having a passage therethrough; and
a second collector mirror,
wherein said first collector mirror (a) receives EUV light from a light source via a first beam path, with a numerical aperture (NA) greater than or equal to about 0.5, (b) reflects said EUV light into a second beam path proceeding to said second collector mirror, and (c) is a concave normal-incidence mirror, and
wherein said second collector mirror (a) is positioned so that a straight line between said light source and a vertex of said first collector mirror does not intersect a mirror surface of said second collector mirror, (b) receives said EUV light from said first collector mirror, and (c) reflects said EUV light through said passage.

* * * * *

UNITED STATES PATENT AND TRADEMARK OFFICE
CERTIFICATE OF CORRECTION

PATENT NO. : 7,781,750 B2  Page 1 of 1
APPLICATION NO. : 10/569574
DATED : August 24, 2010
INVENTOR(S) : Wolfgang Singer It is certified that error appears in the above-identified patent and that said Letters Patent is hereby corrected as shown below:

Column 2,
Line 45, delete "propsed" and insert -- proposed --

Column 3,
Line 60, delete "4a-c" and insert -- 4 a-c --

Column 9,
Line 32, delete "4a-c." and insert -- 4 a-c. --

Column 10,
Line 19, delete "an" and insert -- a --

Signed and Sealed this

Sixteenth Day of November, 2010

David J. Kappos
*Director of the United States Patent and Trademark Office*